(12) United States Patent
Lee et al.

(10) Patent No.: US 9,799,528 B2
(45) Date of Patent: Oct. 24, 2017

(54) APPARATUS AND PACKAGE STRUCTURE OF OPTICAL CHIP

(71) Applicant: Taiwan Semiconductor Manufacturing Company, Ltd., Hsin-Chu (TW)

(72) Inventors: Wan-Yu Lee, Taipei (TW); Chun-Hao Tseng, Taichung (TW); Jui Hsieh Lai, Taoyuan (TW); Tien-Yu Huang, Shuishang Township (TW); Ying-Hao Kuo, Hsin-Chu (TW); Kuo-Chung Yee, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/294,371

(22) Filed: Oct. 14, 2016

(65) Prior Publication Data

US 2017/0033094 A1 Feb. 2, 2017

Related U.S. Application Data

(60) Continuation of application No. 14/745,701, filed on Jun. 22, 2015, now Pat. No. 9,478,475, which is a division of application No. 14/015,757, filed on Aug. 30, 2013, now Pat. No. 9,099,623.

(51) Int. Cl.
*H01L 21/311* (2006.01)
*H01L 21/31* (2006.01)
(Continued)

(52) U.S. Cl.
CPC .......... *H01L 21/31* (2013.01); *G02B 6/12002* (2013.01); *G02B 6/12004* (2013.01); *G02B 6/4214* (2013.01); *H01L 21/311* (2013.01);
*H01L 21/56* (2013.01); *H01L 23/31* (2013.01); *H01L 23/315* (2013.01); *H01L 23/3114* (2013.01); *H01L 23/3121* (2013.01); *H01L 25/167* (2013.01); *H01L 25/50* (2013.01);
(Continued)

(58) Field of Classification Search
CPC . H01L 23/31; H01L 23/3107; H01L 23/3114; H01L 23/315; H01L 23/02; H01L 23/04; H01L 21/31; H01L 21/311; H01L 21/3205; H01L 21/44; H01L 21/469; H01L 21/48; H01L 21/56
See application file for complete search history.

(56) References Cited

U.S. PATENT DOCUMENTS

| | | |
|---|---|---|
| 5,353,498 A | 10/1994 | Fillion et al. |
| 7,217,590 B2 | 5/2007 | Pourquier et al. |

(Continued)

*Primary Examiner* — Eduardo A Rodela
(74) *Attorney, Agent, or Firm* — Slater Matsil, LLP

(57) ABSTRACT

An apparatus includes a package structure. The package structure includes a chip, a conductive structure over the chip, a molding structure surrounding and underneath the chip, and a first passivation layer over the conductive structure. The chip includes an optical component and a chip conductive pad. The conductive structure is electrically coupled to the chip conductive pad. The conductive structure has a planar portion substantially in parallel with an upper surface of the chip. The first passivation layer has a first opening defined therein. The first opening exposes a portion of the planar portion. The package structure is configured to receive an electrical coupling through the first opening in the first passivation layer.

20 Claims, 7 Drawing Sheets

(51) Int. Cl.
*H01L 33/54* (2010.01)
*H01L 33/52* (2010.01)
*H01L 31/0203* (2014.01)
*H01L 23/31* (2006.01)
*H01L 21/56* (2006.01)
*H01L 25/16* (2006.01)
*G02B 6/12* (2006.01)
*G02B 6/42* (2006.01)
*H01L 31/02* (2006.01)
*H01L 33/62* (2010.01)
*H01L 25/00* (2006.01)

(52) U.S. Cl.
CPC .... *H01L 31/02002* (2013.01); *H01L 31/0203* (2013.01); *H01L 33/52* (2013.01); *H01L 33/54* (2013.01); *H01L 33/62* (2013.01); *G02B 2006/12104* (2013.01); *G02B 2006/12147* (2013.01); *H01L 2224/24137* (2013.01); *H01L 2924/1305* (2013.01); *H01L 2924/13091* (2013.01)

(56) References Cited

U.S. PATENT DOCUMENTS

| | | |
|---|---|---|
| 7,627,210 B2 | 12/2009 | Yanagisawa |
| 7,768,125 B2 | 8/2010 | Chow et al. |
| 7,838,357 B2 | 11/2010 | Bogner et al. |
| 8,058,100 B2 | 11/2011 | Pu et al. |
| 2004/0047050 A1 | 3/2004 | Bauer et al. |
| 2004/0212030 A1 | 10/2004 | Asai |
| 2004/0238909 A1 | 12/2004 | Boon et al. |
| 2005/0269687 A1 | 12/2005 | Forcier |
| 2008/0274579 A1 | 11/2008 | Yang et al. |
| 2008/0310793 A1 | 12/2008 | Kodama et al. |
| 2009/0046183 A1 | 2/2009 | Nishida et al. |
| 2009/0286346 A1 | 11/2009 | Adkisson et al. |
| 2010/0135611 A1 | 6/2010 | Asai et al. |
| 2010/0213501 A1 | 8/2010 | Kamei |
| 2011/0057104 A1 | 3/2011 | Yao et al. |
| 2011/0080516 A1 | 4/2011 | Yi et al. |
| 2011/0102657 A1 | 5/2011 | Takahashi et al. |
| 2011/0198762 A1 | 8/2011 | Scanlan |
| 2012/0228664 A1 | 9/2012 | Terano et al. |
| 2012/0241795 A1 | 9/2012 | Chang et al. |
| 2013/0240962 A1 | 9/2013 | Wang et al. |

APPARATUS AND PACKAGE STRUCTURE OF OPTICAL CHIP

PRIORITY CLAIM AND CROSS-REFERENCE

This application is a continuation of U.S. patent application Ser. No. 14/745,701, filed Jun. 22, 2015, entitled "Apparatus and Package Structure of Optical Chip," which is a divisional of U.S. patent application Ser. No. 14/015,757, filed on Aug. 30, 2013 (now U.S. Pat. No. 9,099,623, Issued Aug. 4, 2015) entitled "Manufacture Including Substrate and Package Structure of Optical Chip," which patent applications are incorporated herein by reference.

The instant application is related to U.S. application Ser. No. 14/015,513, filed Aug. 30, 2013 (now U.S. Pat. No. 9,419,156, Issued Aug. 16, 2016). The entire contents of the above-referenced application are incorporated by reference herein.

BACKGROUND

Optical signals are usable for high speed and secure data transmission between two devices. In some applications, a device capable of optical data transmission includes at least an integrated circuit (IC or "chip") having an optical component for transmitting and/or receiving optical signals. Also, the device usually has one or more other optical or electrical components, a waveguide for the transmission of the optical signals, and a support, such as a substrate of a printed circuit board, on which the chip equipped with the optical component and the one or more other components are mounted. Various approaches for mounting a chip equipped with an optical component on a substrate have been studied.

BRIEF DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

Figure 1:
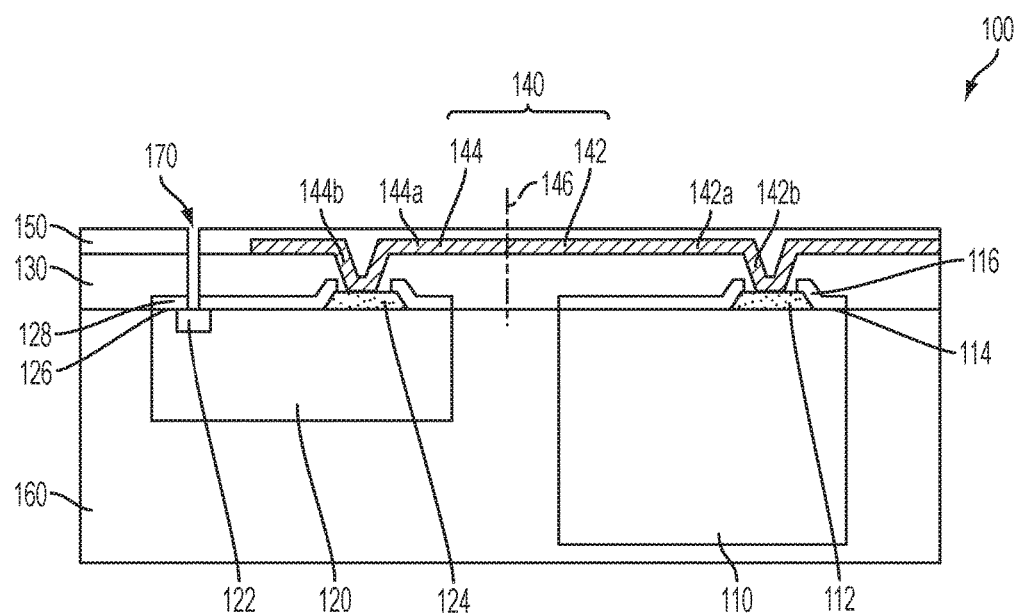
FIG. 1 is a cross-sectional view of a package structure in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

In some applications, a chip having an optical component (also referred to as an optical chip) is encapsulated by a molded package structure, and the molded package structure is mounted on a PCB substrate. Compared with a configuration without using the molded package structure, the embodiments described herein allow a shortened conductive path between the optical chip and the PCB. In some embodiments, shortened conductive path means lowered parasitic capacitance and resistance along the conductive path, and thus in turn helps to decrease power loss and increase operation frequency of the resulting device. In some embodiments using an interposer to connect the molded package structure and the PCB substrate, a through-silicon-via structure formed in the interposer is capable of being fabricated after mounting the molded package structure to the interposer (i.e., "via-last" process). By doing so, fabrication processes and masks for forming bump structures on corresponding sides of the interposer and the molded package structure are omitted.

FIG. 1 is a cross-sectional view of a package structure 100 in accordance with one or more embodiments. Package structure 100 includes a first chip 110, a second chip 120, a first passivation layer 130, a redistribution structure 140 over first passivation layer 130, and a second passivation layer 150 over redistribution structure 140. Package structure 100 further includes a molding structure 160 surrounding and underneath first chip 110 and second chip 120.

In some embodiments, first chip 110 includes one or more active components and/or passive components configured to process, receive and/or transmit electrical signals. Examples of passive components include, but are not limited to, resistors, capacitors, and inductors. Examples of active components include, but are not limited to, diodes, field effect transistors (FETs), metal-oxide-semiconductor FETs (MOSFETs), complementary metal-oxide-semiconductor (CMOS) transistors, and bipolar transistors. In some embodiments, first chip 110 includes a bare chip or die. In some embodiments, first chip 110 includes a stack of chips. In some embodiments, first chip 110 is configured to perform predetermined logic, analog, or mixed mode functionality. In some embodiments, first chip 110 has a thickness ranging from 50 µm to 750 µm.

First chip 110 includes at least one conductive pad 112 on an upper surface 114 of first chip 110. Conductive pad 112 is electrically coupled to the one or more active components and/or passive components of first chip 110 for communication of electrical signals between first chip 110 and external circuitry. Example materials of the conductive pad 112 include, but are not limited to, aluminum, copper, or a combination thereof. First chip 110 further has a passivation layer 116 over the upper surface 114. Passivation layer 116 has an opening that exposes at least a portion of conductive pad 112. Example materials of the passivation layer 116 include, but are not limited to, silicon oxide, silicon nitride, low dielectric constant (low-)k dielectric materials such as carbon doped oxides, extremely low-k dielectric materials such as porous carbon doped silicon dioxide, or a combination thereof.

Second chip 120 includes at least one optical component 122 configured to process, receive, and/or transmit optical signals. Second chip 120 is thus also being referred to as an optical chip in some applications. Optical signals are electromagnetic signals exhibiting a characteristic capable of being modeled by photons and are different from electrical signals which are signals carried by electrical charges, such as electrons, holes, or ions. In some embodiments, optical signals include electromagnetic signals having a wavelength less than 1 mm. Examples of optical components include, but are not limited to, light emitting devices such as lasers and light emitting diodes, light detecting devices such as photo-sensors, optical modulators, and optical couplers. In at least one embodiment, second chip 120 further includes one or more active and/or passive components configured to process, receive and/or transmit electrical signals converted to/from optical signals by the optical component 122. In some embodiments, second chip 120 has a thickness ranging from 100 μm to 350 μm.

Second chip 120 includes at least one conductive pad 124 on an upper surface 126 of first chip 120. Second chip 120 also has a passivation layer 128 over upper surface 126 and exposing a portion of conductive pad 124. Example materials of the conductive pad 124 include, but are not limited to, aluminum, copper, gold, or a combination thereof. Example materials of the passivation layer 128 include, but are not limited to, silicon oxide, silicon nitride, low-k dielectric materials such as carbon doped oxides, extremely low-k dielectric materials such as porous carbon doped silicon dioxide, or a combination thereof. In some embodiments, passivation layer 128 and passivation layers 130 and 150 have an opening 170 defined therein to allow transmitting and/or receiving of optical signals by the optical component 122. In at least one embodiment, passivation layer 128 is made of a material transparent to optical signals transmitted and/or received by the optical component 122, and a portion of the opening 170 corresponding to the passivation layer 128 is thus omitted.

Passivation layer 130 is over and covering conductive pads 112 and 124 and passivation layers 116 and 128. In some embodiments, passivation layer 130 includes epoxy, polyimide, benzocyclobutene (BCB), polybenzoxazole (PBO), or other organic dielectric materials. In one or more embodiments, passivation layer 130 is formed of a material similar to the material used for forming passivation layers 116 or 128, such as silicon oxides, silicon nitrides, low-k dielectric materials, extremely low-k dielectric materials, or a combination thereof. In at least one embodiment, passivation layer 130 is made of a material transparent to optical signals transmitted and/or received by the optical component 122, and a portion of the opening 170 corresponding to the passivation layer 130 is thus omitted. In some embodiments, passivation layer 130 has a thickness ranging from 3 μm to 10 μm.

Redistribution structure 140 includes a first conductive structure 142 electrically coupled to the conductive pad 112 and a second conductive structure 144 electrically coupled to the conductive pad 124. In the embodiment depicted in FIG. 1, first conductive structure 142 and second conductive structure 142 are connected and in physical contact at a reference line 146. First conductive structure 142 includes a planar portion 142a substantially in parallel with upper surface 114 of first chip 110 and a protrusion 142b connecting the conductive pad 112 and the planar portion 142a. Second conductive structure 144 includes a planar portion 144a substantially in parallel with upper surface 126 of second chip 120 and a protrusion 144b connecting the conductive pad 124 and the planar portion 144a. In the embodiment depicted in FIG. 1, planar portions 142a and 144b are in physical contact with each other at reference line 146. In some embodiments, planar portions 142a and 144b are not in physical contact with each other.

In some embodiments, conductive structures 142 and 144 include copper, aluminum, nickel, gold, tungsten, or a combination thereof. In some embodiments, conductive structures 142 and 144 each has one or more conductive layers suitable for obscuring metal atoms from diffusion into structures above or underneath redistribution structure 140. In some embodiments, conductive structures 142 and 144 are also referred to as post-passivation interconnect (PPI) structures. In some embodiments, conductive structures 142 and 144 are formed using a CMOS Back-End-of-Line (BEOL) process.

Passivation layer 150 is over and covering redistribution structure 140. In some embodiments, passivation layer 150 includes epoxy, polyimide, benzocyclobutene (BCB), polybenzoxazole (PBO), or other organic dielectric materials. In one or more embodiments, passivation layer 150 is formed of a material similar to the material used for forming the passivation layers 116 or 128, such as silicon oxides, silicon nitrides, low-k dielectric materials, extremely low-k dielectric materials, or a combination thereof. In some embodiments, passivation layer 150 and passivation layer 130 are made of different materials. In at least one embodiment, passivation layer 150 is made of a material transparent to optical signals transmitted and/or received by the optical component 122, and a portion of the opening 170 corresponding to the passivation layer 150 is thus omitted. In some embodiments, passivation layer 150 has a thickness ranging from 3 μm to 10 μm.

Molding structure 160 is surrounding and underneath first chip 110 and second chip 120 to protect surfaces of chips 110 and 120 that are not covered by passivation layers 130 and 150. In some embodiments, molding structure 160 has a thickness that is sufficient to enclose bottom surfaces of chips 110 and 120. In some embodiments, molding structure 160 comprises a material that has a thermal expansion coefficient about or between those of chips 110 and 120. In some embodiments, molding structure 160 comprises a material that has a thermal expansion coefficient ranging from 4 to 9. In some embodiments, example materials of the molding structure 160 include, but are not limited to silicone rubber, epoxy resins, other resins, or other epoxy materials.

Although only one conductive pad 112 or 124 for each chip 110 or 120 and only two corresponding conductive structures 142 and 144 are depicted in FIG. 1, in some embodiments, there are more than one conductive pad on each chip 110 or 120 and are variously connected by redistribution structure 140. In some embodiments, there are one or more other chips in addition to chips 110 and 120 included in the package structure 100. In some embodiments, only one of first chip 110 and second chip 120 is present, and the other one of first chip 110 and second chip 120 is omitted.

Figure 2:
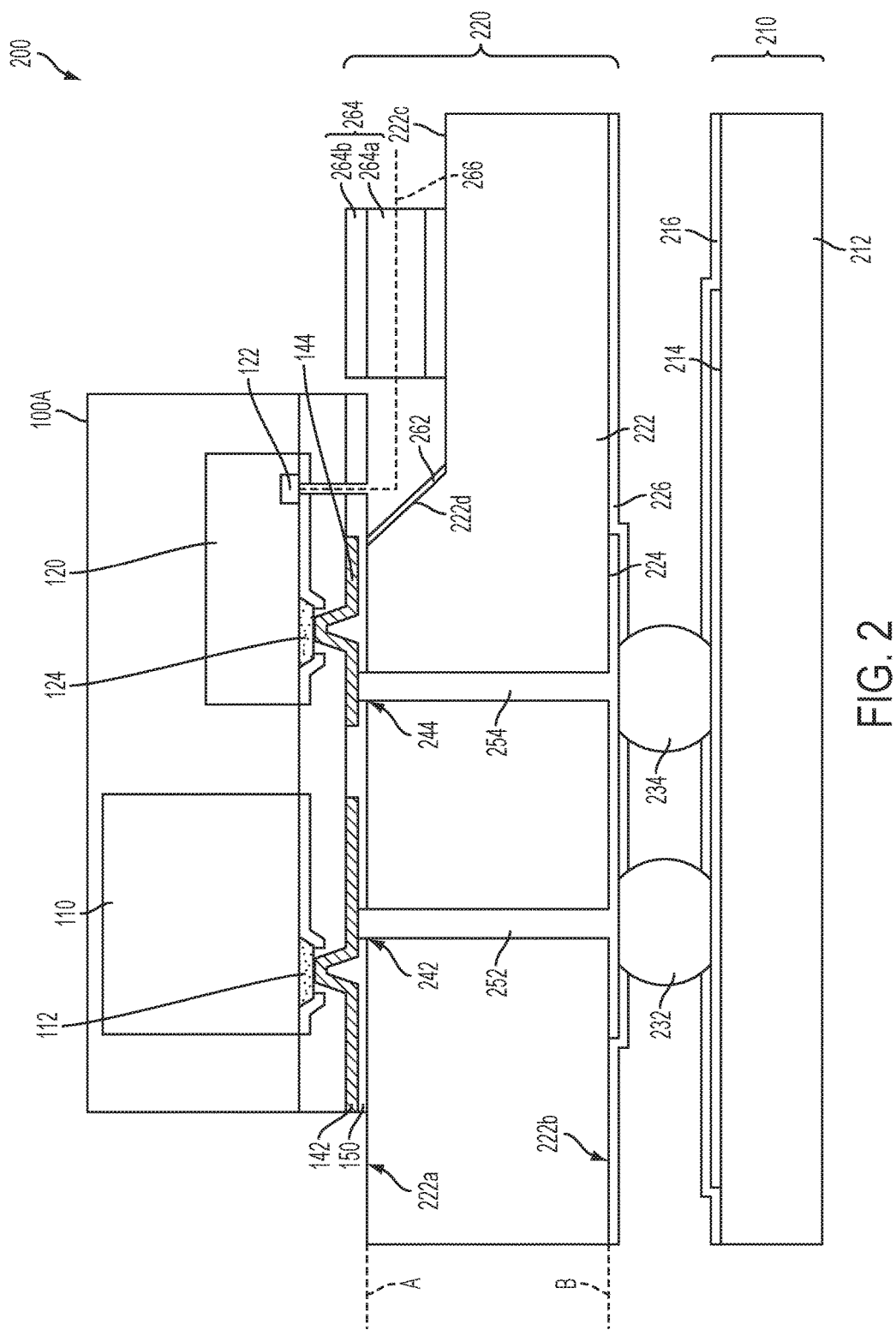
FIGS. 2-7 are cross-sectional view of various manufactures in accordance with one or more embodiments.

FIG. 2 is a cross-sectional view of a first example manufacture 200 having a package structure 100A mounted on a printed circuit board (PCB) 210 in accordance with one or more embodiments. Components of package structure 100A that are similar to those of package structure 100 are given the same reference numbers, and detailed description thereof is omitted.

Manufacture 200 includes PCB 210, an interposer 220 mounted on PCB 210, and package structure 100A mounted on interposer 220. PCB 210 includes a substrate 212, a conductive pad 214 on the substrate 212, and a passivation layer 216 over and exposing a portion of conductive pads 214. Interposer 220 includes a substrate 222, and substrate 222 includes a first surface 222a defining a first reference plane A, a second surface 222b defining a second reference plane B, a third surface 222c between the first and second reference planes, and a tilt surface 222d connecting the first and third surfaces. Interposer substrate 220 also includes a conductive pad 224 on the second surface 222b and passivation layer 226 on and exposing a portion of the conductive pads 224. The exposed portions of conductive pads 214 and 224 are physically and electrically connected by one or more corresponding solder balls 232 and 234.

In some embodiments, a thickness between first surface 222a and second surface 222b ranges from 40 µm to 200 µm. In some embodiments, a thickness between third surface 222c and first surface 222a ranges from 20 µm to 100 µm.

Package structure 100A has openings 242 and 244 defined in the passivation layer 150 and exposing a portion of corresponding conductive pads 142 and 144. Package structure 100A is mounted on first surface 222a of the substrate 222. In some embodiments, package structure 100A is attached to first surface 222a by a layer of adhesive material (not shown) disposed therebetween. Interposer 200 further includes one or more conductive members 252 and 254 of a same material extending across the first reference plane A and the second reference plane B and into the openings 242 and 244. Conductive members 252 and 254 are electrically coupled to the exposed portion of the planar portions of conductive structures 142 and 144 and conductive pad 224. In some embodiments, conductive structures 142 and 144 are not electrically coupled with each other through conductive members 252 and 254. In some embodiments, there are more or less than two conductive members 252 and 254 in interposer 220. In some applications, conductive members 252 and 254 are via structures through substrate 222. In some embodiments, conductive members 252 and 254 are formed after package structure 100A is mounted on the substrate 222.

Manufacture 200 further includes a reflective structure 262 on the tilt surface 222d of the substrate 222 and a waveguide 264 on the third surface 222c of the substrate 222. Waveguide 264 includes a core region 264a and a cladding region 264b. In some embodiments, core region 264a and cladding region 264b have different reflective coefficients and are arranged to allow an optical signal of a predetermined wavelength to travel within the core region 264a. Waveguide 264 and the reflective structure 262 are arranged to define an optical path 266 from the optical component 122 of the chip 120 to the waveguide 264 through the reflective structure 262. In some embodiments, tilt surface 222d has a predetermined angle with respect to third surface 222c in order that is sufficient to allow the reflective structure 262 to define optical path 266. In some embodiments, the predetermined angle between tilt surface 222d and third surface 222c ranges from 40 degrees to 50 degrees.

Figure 3:
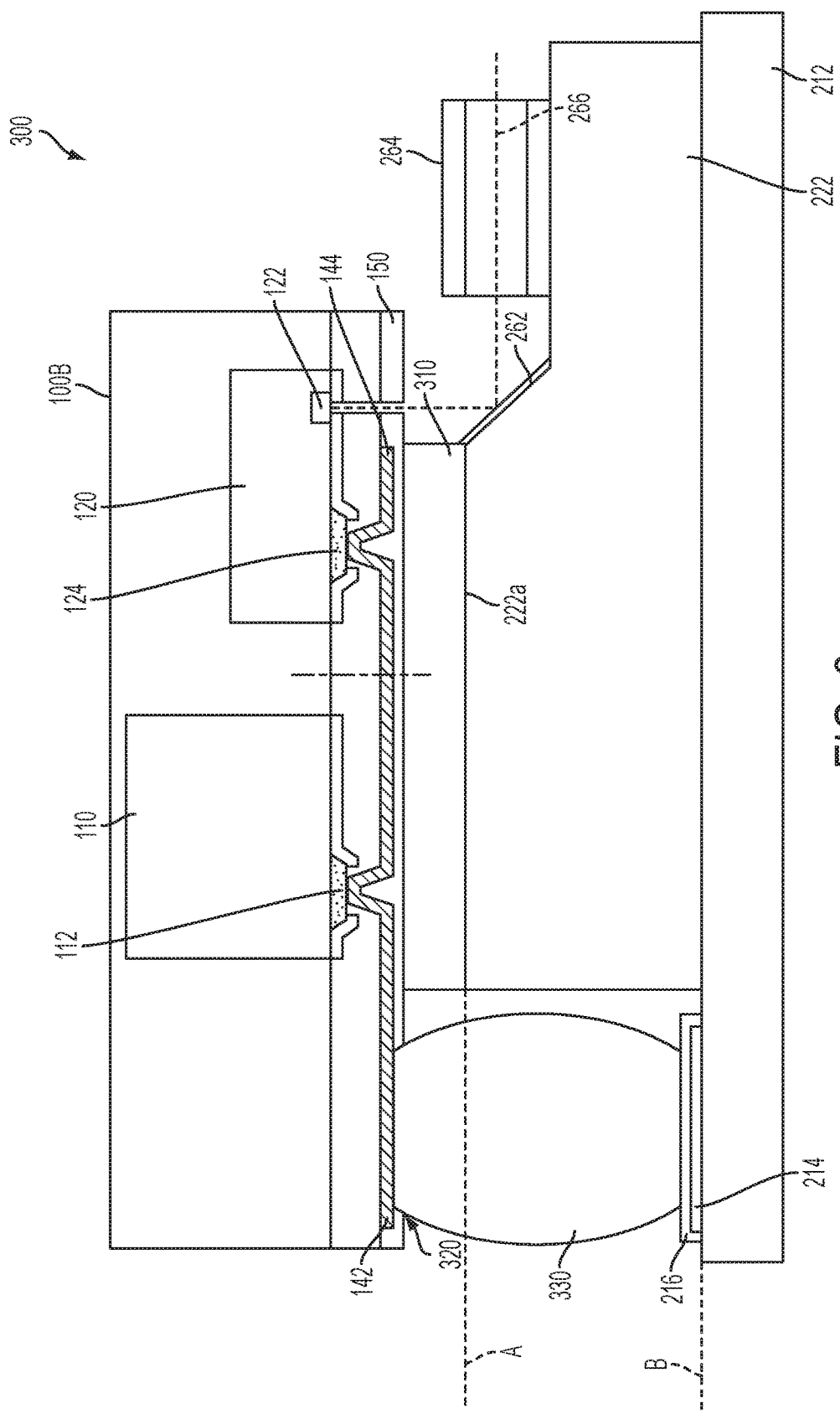

FIG. 3 is a cross-sectional view of a second example manufacture 300 having a package structure 100B mounted on a PCB substrate 212 in accordance with one or more embodiments. Components of manufacture 300 similar to those of manufacture 200 are given the same reference numbers, and detailed description thereof is omitted.

Compared with manufacture 200, substrate 222 of manufacture 300 is mounted on substrate 212 using a layer of adhesive material (not shown). Manufacture 300 includes a spacer 310 between passivation layer 150 of package structure 100B and surface 222a of substrate 222. Package structure 100B is mounted on the spacer 310, and the spacer 310 is mounted on surface 222a of substrate 222. In some embodiments, spacer 310 and package structure 100B or spacer 310 and substrate 222 has a layer of adhesive material (not shown) for holding various structures together. In some embodiments, spacer 310 is working as an adhesive layer to secure package structure 100B on substrate 222. In some embodiments, spacer 310 includes a dielectric film or a polymer film. In some embodiments, spacer 310 is formed by performing a Chemical Vapor Deposition (CVD) process or a spin-on coating process. In some embodiments, spacer 310 has a thickness usable to adjust a distance between package structure 100B and substrate 222 and/or package structure 100B and substrate 212. In some embodiments, spacer 310 has a thickness ranging from 0.1 µm to 10 µm.

Passivation layer 150 of package structure 100B has an opening 320 defined therein. Opening 320 exposes a portion of a planar portion of conductive structure 142. Manufacture 300 further includes a solder ball 330 outside substrate 222 and working as a conductive member extending across the first reference plane A and the second reference plane B and into the opening 320. Solder ball 330 is electrically coupled to the exposed portion of the planar portion of conductive structure 142 and conductive pad 214. In some embodiments, there are more than one solder ball 330 in manufacture 300 connecting corresponding conductive structures of package structure 100B and conductive pads on substrate 212.

Figure 4:
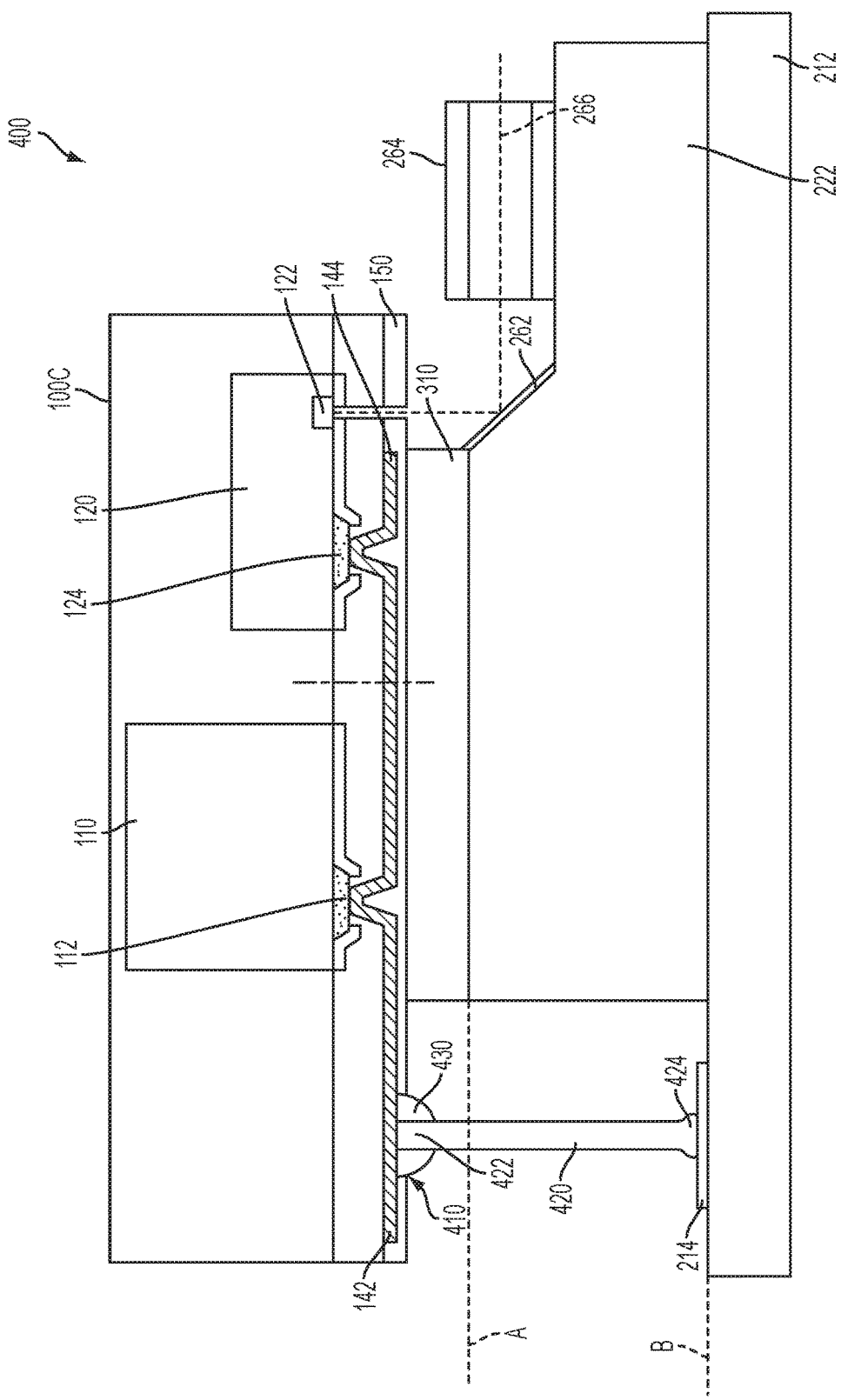

FIG. 4 is a cross-sectional view of a third example manufacture 400 having a package structure 100C mounted on a PCB substrate 212 in accordance with one or more embodiments. Components of manufacture 400 similar to those of manufactures 200 and 300 are given the same reference numbers, and detailed description thereof is omitted.

Compared with manufacture 300, passivation layer 150 of package structure 100C has an opening 410 defined therein. Opening 410 exposes a portion of a planar portion of conductive structure 142. Manufacture 400 further includes a metallic stud 420 outside substrate 222 and working as a conductive member extending across the first reference plane A and the second reference plane B and into the opening 410. Metallic stud 420 has a first end 422 connected to the exposed portion of conductive structure 142 by using solder member 430 surrounding the first end 422 of the metallic stud 420. Metallic stud 420 also has a second end 424 connected to the conductive pad 214 of the PCB substrate 212. In some embodiments, metallic stud 420 includes copper, gold, aluminum, nickel, silver, tin, indium, or a combination thereof.

Figure 5:
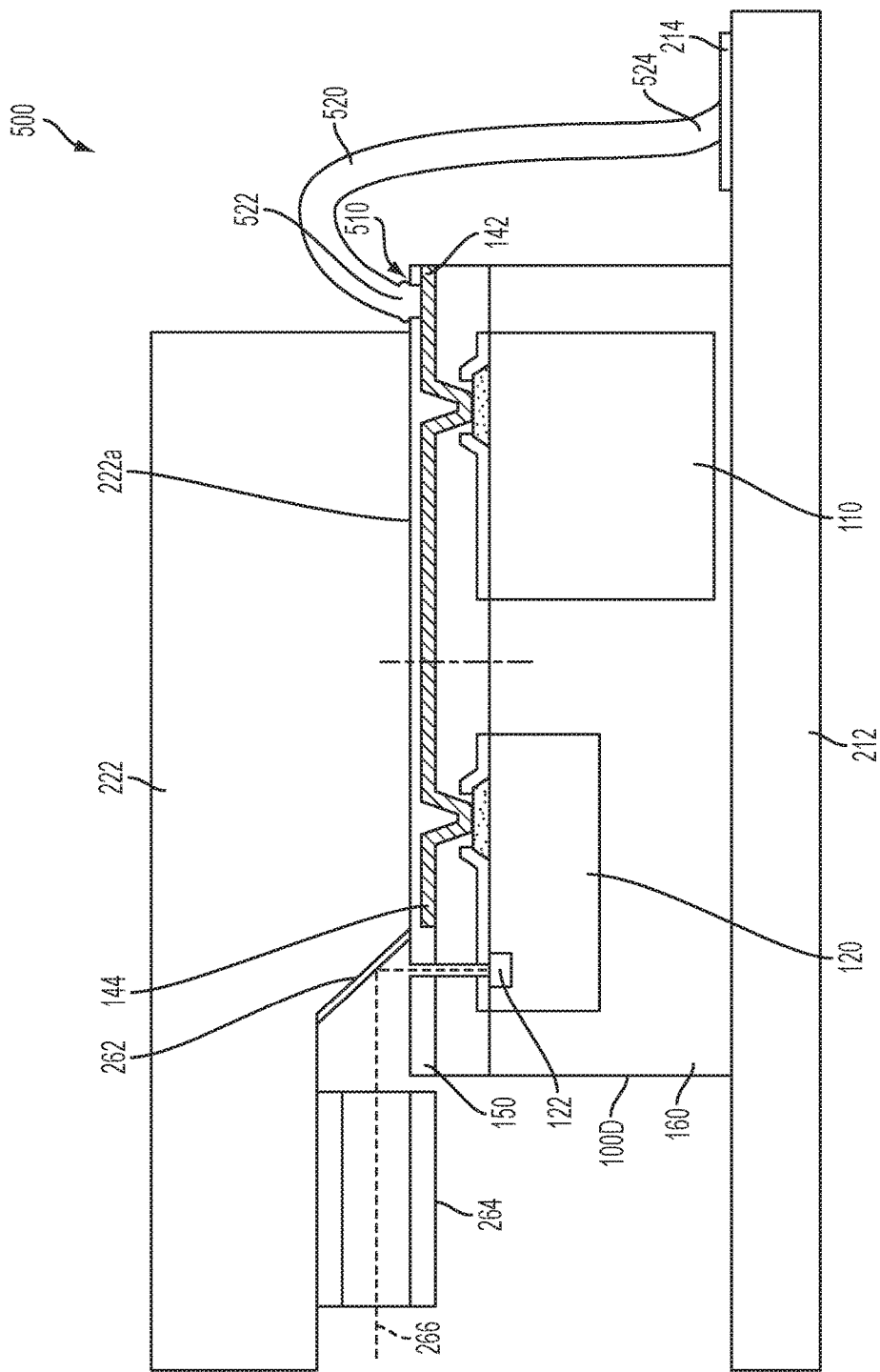

FIG. 5 is a cross-sectional view of a fourth example manufacture 500 having a package structure 100D mounted on a PCB substrate 212 in accordance with one or more embodiments. Components of manufacture 500 similar to those of manufactures 200, 300, and 400 are given the same reference numbers, and detailed description thereof is omitted.

Compared with manufactures 200, 300, and 400, substrate 222 of manufacture 500 has a surface 222a attached to passivation layer 150 of the package structure 100D. In some embodiments, substrate 222 and passivation layer 150 are secured by a layer of adhesive material (not shown) disposed therebetween. Substrate 212 of manufacture 500 is attached to molding structure 160. In some embodiments, substrate 212 and molding structure 160 are secured by a layer of adhesive material (not shown) disposed therebetween.

Passivation layer 150 of package structure 100D has an opening 510 defined therein. Opening 510 exposes a portion of a planar portion of conductive structure 142. Manufacture 500 further includes a bond wire 520 extending into the opening 510. Bond wire 520 has a first end 522 connected to the exposed portion of conductive structure 142 and a second end 524 connected to the conductive pad 214 of the PCB substrate 212. In some embodiments, bond wire 520 includes copper, gold, aluminum, silver, tin, indium, or a combination thereof.

Figure 6:
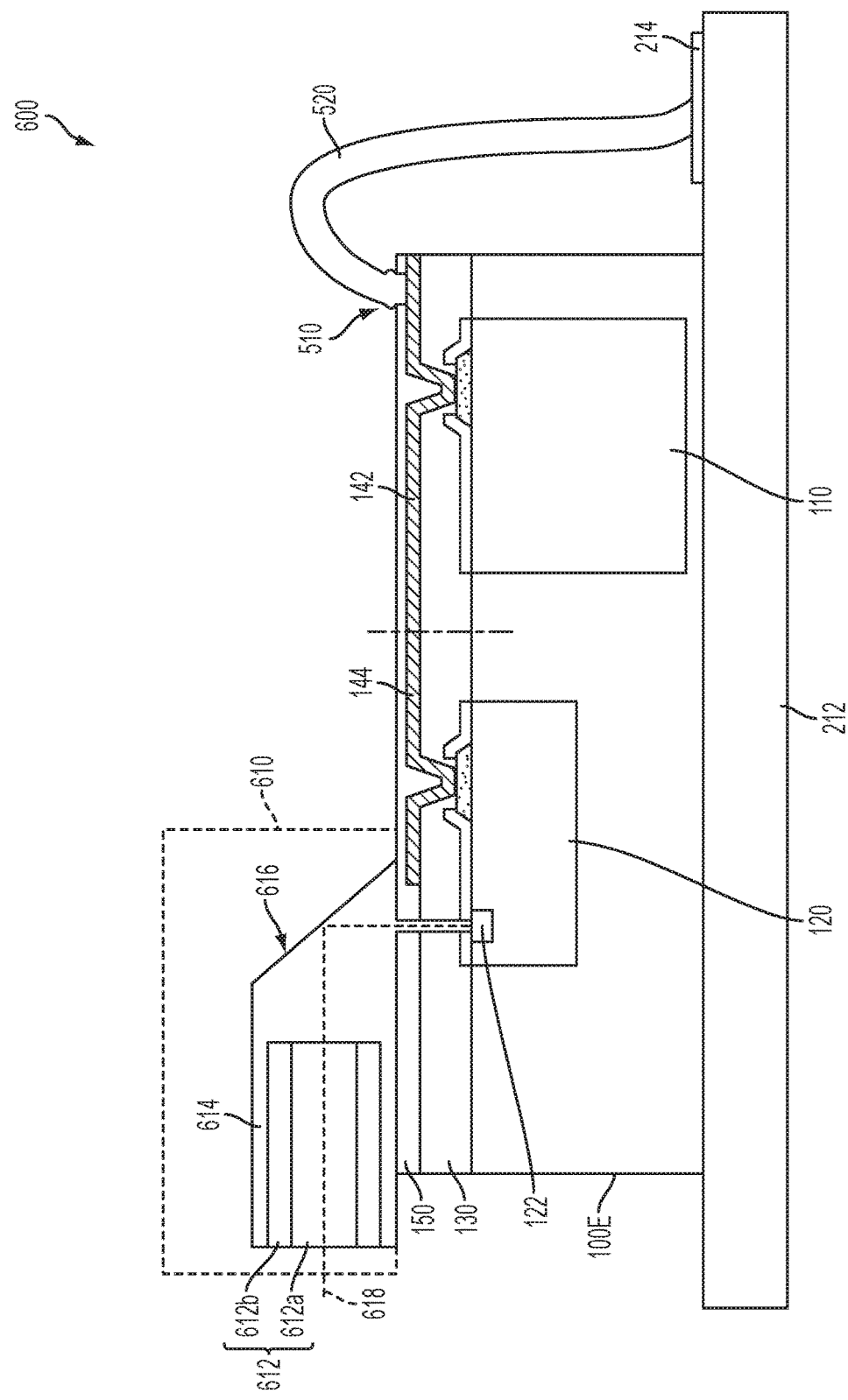

FIG. 6 is a cross-sectional view of a fifth example manufacture 600 having a package structure 100E mounted on a PCB substrate 212 in accordance with one or more embodiments. Components of manufacture 600 similar to those of manufactures 200, 300, 400, and 500 are given the same reference numbers, and detailed description thereof is omitted.

Compared with manufacture 500, interposer 220 and reflective structure 262 and waveguide 264 mounted thereon are omitted. Instead, waveguide unit 610 is disposed on the passivation layer 150 and arranged to be optically communicative with the optical component 122 of chip 120. Waveguide unit 610 includes a waveguide 612 and a molding structure 614. Waveguide 612 includes a core region 612a and a cladding region 612b. In some embodiments, core region 612a and cladding region 612b have different reflective coefficients and are arranged to allow an optical signal of a predetermined wavelength to travel within the core region 612a. Molding structure 614 affixes waveguide 612 to a predetermined position on the package structure 100E. Molding structure 614 has a tilt surface 616 working as a reflective structure. Waveguide 614 and the reflective structure 616 are arranged to define an optical path 618 from the optical component 122 of the chip 120 to the waveguide 612 through the reflective structure 616.

Figure 7:
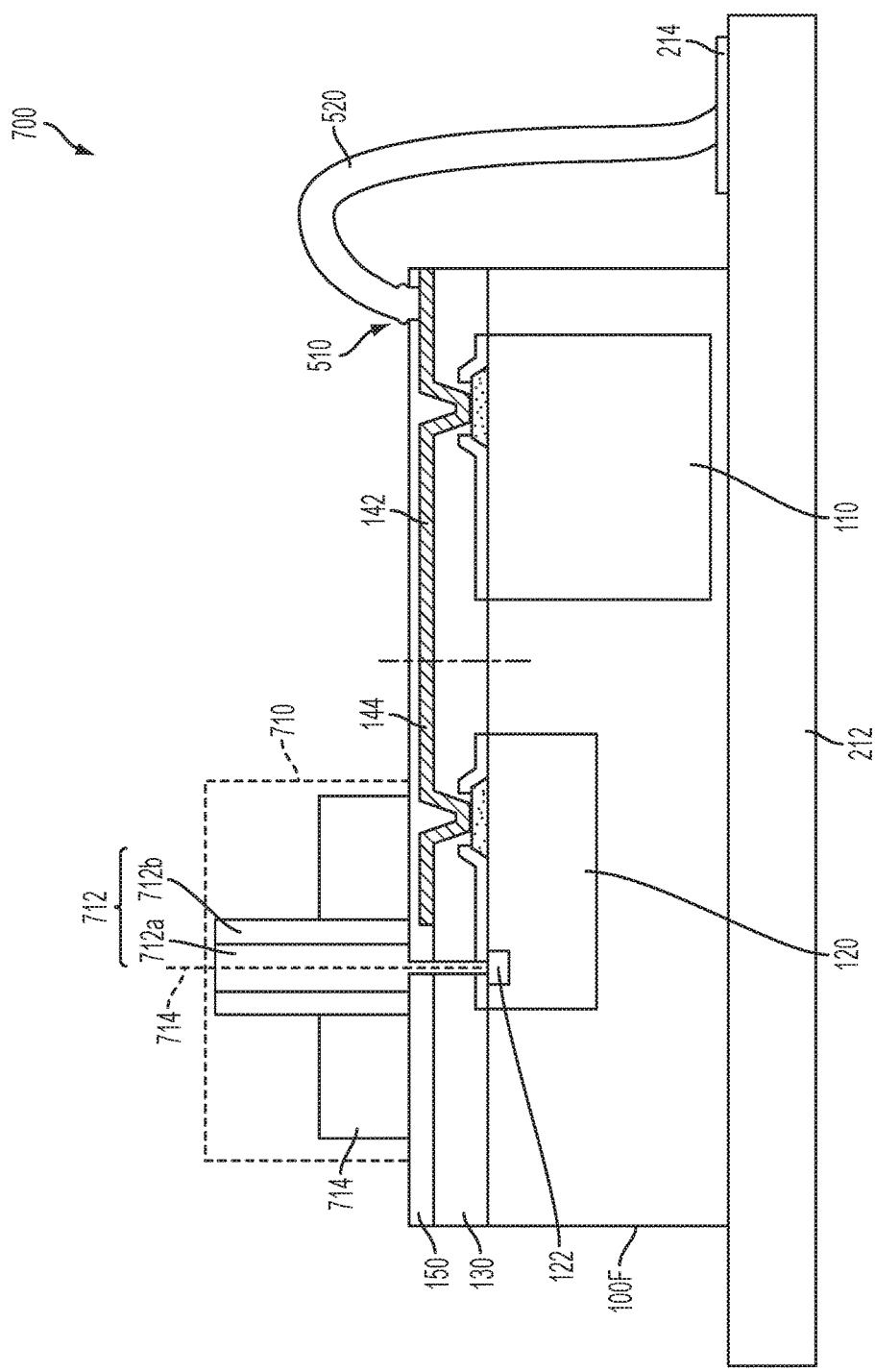

FIG. 7 is a cross-sectional view of a fifth example manufacture 700 having a package structure 100F mounted on a PCB substrate 212 in accordance with one or more embodiments. Components of manufacture 700 similar to those of manufactures 200, 300, 400, 500, and 600 are given the same reference numbers, and detailed description thereof is omitted.

Manufacture 700 includes a waveguide unit 710 disposed on the passivation layer 150 and arranged to be optically communicative with the optical component 122 of chip 120. Waveguide unit 710 includes a waveguide 712 and a molding structure 714. Waveguide 712 includes a core region 712a and a cladding region 712b. In some embodiments, core region 712a and cladding region 712b have different reflective coefficients and are arranged to allow an optical signal of a predetermined wavelength to travel within the core region 712a. Molding structure 714 affixes waveguide 712 to a predetermined position on the package structure 100F. Compared with manufactures 600, waveguide 612 of manufacture 700 is arranged to have core region 712a coinciding an optical path 714 defined by the optical component 122 of the chip 120, and a reflective structure on molding structure 714 that corresponds to reflective structure 616 is omitted.

An aspect of this description is related to an apparatus comprising a package structure. The package structure comprises a chip. The chip comprises an optical component and a chip conductive pad. The package structure also comprises a conductive structure over the chip. The conductive structure is electrically coupled to the chip conductive pad. The conductive structure comprises a planar portion substantially in parallel with an upper surface of the chip. The package structure further comprises a molding structure surrounding and underneath the chip. The package structure additionally comprises a first passivation layer over the conductive structure. The first passivation layer comprises a first opening defined therein. The first opening exposes a portion of the planar portion. The package structure is configured to receive an electrical coupling through the first opening in the first passivation layer.

Another aspect of this description is related to an apparatus comprising a package structure. The package structure comprises a first chip. The first chip comprises an optical component and a first conductive pad. The package structure also comprises a second chip. The second chip comprises a second conductive pad. The package structure further comprises a first conductive structure over the first chip and electrically coupled to the first conductive pad. The package structure additionally comprises a second conductive structure over the second chip, electrically coupled to the second conductive pad, and electrically coupled to the first conductive structure. The package structure also comprises a molding structure surrounding and underneath the first chip and the second chip. The package structure further comprises a first passivation layer over the first conductive structure and the second conductive structure. The first passivation layer comprises a first opening and a second opening defined therein. The first opening exposes the first conductive structure or the second conductive structure. The apparatus also comprises a waveguide over the first passivation layer. The second opening is positioned to provide an optical path between the optical component and the waveguide. The waveguide has an internal optical path vertically aligned with the optical path provided by the second opening.

A further aspect of this description is related to an apparatus comprising a package structure. The package structure comprises a first chip. The first chip comprises an optical component and a first conductive pad. The package structure also comprises a second chip. The second chip comprises a second conductive pad. The package structure further comprises a first conductive structure over the first chip and electrically coupled to the first conductive pad. The package structure additionally comprises a second conductive structure over the second chip, electrically coupled to the second conductive pad. The package structure also comprises a molding structure surrounding and underneath the first chip and the second chip. The package structure further comprises a first passivation layer over the first conductive structure and the second conductive structure. The first passivation layer comprises a first opening and a second opening defined therein. The apparatus also comprises a waveguide over the first passivation layer. The second opening is positioned to provide an optical path between the optical component and the waveguide. The waveguide has an internal optical path that forms an angle greater than 0 degrees with respect to the optical path provided by the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first package comprising:
encapsulating a first chip in a molding structure, the first chip comprising an optical component and a first conductive pad;
forming a first conductive structure over the first chip and electrically coupled to the first conductive pad;
forming a passivation layer over the first conductive structure and the first chip;
patterning the passivation layer to have a first opening and a second opening, the first opening exposing a portion of the first conductive structure, the second opening exposing a portion of the optical component;
mounting the first package on a first substrate, the first substrate comprising
a first surface defining a first reference plane and a second surface defining a second reference plane; and
forming a conductive member extending across the first reference plane and the second reference plane and into the first opening, the conductive member being electrically coupled to the exposed portion of the first conductive structure.

2. The method of claim 1, wherein conductive member comprises a solder ball, a bond wire, or a metallic stud outside the first substrate.

3. The method of claim 1 further comprising:
mounting the first substrate to a second substrate using the conductive member, the second substrate comprising a conductive pad, the first substrate being between the first package and the second substrate, the conductive member being a solder ball connecting the exposed portion of the first conductive structure and the conductive pad of the second substrate.

4. The method of claim 1 further comprising:
mounting the first substrate to a second substrate using the conductive member and a solder member, the second substrate comprising a conductive pad, the solder member being on the exposed portion of the first conductive structure, the first substrate being between the first package and the second substrate, the conductive member being a metallic stud having a first end connected to the solder member and the first conductive structure and a second end connected to the conductive pad of the second substrate.

5. The method of claim 1, wherein the first substrate further comprises a third surface between the first reference plane and the second reference plane; and a tilt surface connecting the first surface and the third surface, a reflective structure on the tilt surface of the first substrate.

6. The method of claim 5 further comprising:
disposing a waveguide on the third surface of the first substrate, the waveguide and the reflective structure being arranged to define an optical path from the optical component of the first chip to the waveguide through the reflective structure.

7. The method of claim 1 wherein mounting the first package on the first substrate comprises:
adhering the first package to the first substrate using an adhesive layer.

8. The method of claim 1, wherein after mounting the first package to the first substrate, a spacer is between the passivation layer of the first package and the first surface of the first substrate.

9. A method comprising:
forming a first package comprising:
encapsulating a first chip in a first molding structure, the first chip comprising an optical component and a first conductive pad;
forming a first conductive structure over the first chip and electrically coupled to the first conductive pad;
forming a passivation layer over the first conductive structure and the first chip;
patterning the passivation layer to have a first opening and a second opening, the first opening exposing a portion of the first conductive structure, the second opening exposing a portion of the optical component, the first and second openings being on a first side of the first package; and
mounting a waveguide over the passivation layer with a mounting structure, the second opening providing an optical path between the optical component and the waveguide, the waveguide having an internal optical path that forms an angle greater than 0 degrees with respect to the optical path provided by the second opening.

10. The method of claim 9 further comprising:
mounting a second side of the first package on a first substrate, the second side of the first package being opposite the first side of the first package; and
forming a conductive member from the first substrate to contact the first conductive structure through the first opening.

11. The method of claim 10, wherein the conductive member is a bond wire.

12. The method of claim 9, wherein the mounting structure for the waveguide comprises a reflective surface configured to change a direction of the optical path provided by the second opening.

13. The method of claim 9, wherein the mounting structure comprises a second molding structure adjoining the passivation layer, the waveguide being within the second molding structure.

14. The method of claim 9, wherein the mounting structure comprises a second substrate adjoining the passivation layer, the waveguide adjoining the second substrate.

15. A method comprising:
forming a first package comprising:
encapsulating a first chip in a first molding structure, the first chip comprising an optical component and a first conductive pad;
forming a first conductive structure over the first chip and electrically coupled to the first conductive pad;
forming a passivation layer over the first conductive structure and the first chip;
patterning the passivation layer to have a first opening and a second opening, the first opening exposing a portion of the first conductive structure, the second opening exposing a portion of the optical component, the first and second openings being on a first side of the first package; and
mounting a waveguide over the passivation layer with a mounting structure, the second opening providing an optical path between the optical component and the waveguide, the waveguide having an internal optical path collinear with the optical path provided by the second opening.

16. The method of claim 15 further comprising:
mounting a second side of the first package on a first substrate, the second side of the first package being opposite the first side of the first package; and forming a conductive member from the first substrate to contact the first conductive structure through the first opening.

17. The method of claim 16, wherein the conductive member is a bond wire.

18. The method of claim 16, wherein mounting the second side of the first package on the first substrate comprises:
adhering the second side of the first package to the first substrate using an adhesive layer.

19. The method of claim 15, wherein the mounting structure comprises a second molding structure adjoining the passivation layer, the waveguide being within the second molding structure.

20. The method of claim 19, wherein the passivation layer is between the first molding structure and the second molding structure.

* * * * *